(12) United States Patent
Von Sengbusch

(10) Patent No.: US 8,825,419 B2
(45) Date of Patent: Sep. 2, 2014

(54) METHOD AND DEVICE FOR DETERMINING AN INPUT VOLTAGE ON A TRANSFORMING STATION OF A POWER NETWORK

(75) Inventor: Klaus Von Sengbusch, Mannheim (DE)

(73) Assignee: ABB Technology AG, Zurich (CH)

( * ) Notice: Subject to any disclaimer, the term of this patent is extended or adjusted under 35 U.S.C. 154(b) by 342 days.

(21) Appl. No.: 13/441,322

(22) Filed: Apr. 6, 2012

(65) Prior Publication Data

US 2012/0265463 A1      Oct. 18, 2012

Related U.S. Application Data

(63) Continuation of application No. PCT/EP2010/006003, filed on Oct. 1, 2010.

(30) Foreign Application Priority Data

Oct. 9, 2009   (DE) .......................... 10 2009 048 509

(51) Int. Cl.
*G01R 19/00*   (2006.01)
*G01R 19/25*   (2006.01)
*G06F 11/30*   (2006.01)

(52) U.S. Cl.
CPC ................................. *G01R 19/2513* (2013.01)
USPC .............. 702/64; 702/182; 702/189; 702/190

(58) Field of Classification Search
CPC ........................... G01R 19/2513; G01R 27/16
USPC ...................................... 702/64–75, 182–190
See application file for complete search history.

(56) References Cited

U.S. PATENT DOCUMENTS 6,326,796 B1 *  12/2001  Koda et al. ..................... 324/707
2004/0073387 A1 *  4/2004  Larsson et al. ................... 702/57
2009/0088995 A1    4/2009  Tiberg et al.

FOREIGN PATENT DOCUMENTS

DE           100 18 220 A1   11/2000
DE           101 17 643 A1   12/2002
WO     WO 2007/140627 A1    12/2007

OTHER PUBLICATIONS

ISR for PCT/EP2010/006003.*
International Search Report (PCT/ISA/210) issued on Apr. 11, 2011, by European Patent Office as the International Searching Authority for International Application No. PCT/EP2010/006003.
German Search Report for DE 10 2009 048 509.0 dated Jun. 10, 2010.

(Continued)

*Primary Examiner* — Phoung Huynh
(74) *Attorney, Agent, or Firm* — Buchanan Ingersoll & Rooney PC

(57) ABSTRACT

A method and device are provided for determining an input voltage of a transformer of a local network station. The method includes measuring an input current of the transformer, an output current of the transformer, an output voltage of the transformer, and a phase angle between the output current and output voltage. The method also includes determining a translation ratio and an admittance of a cross-member of a p-equivalent circuit diagram of the transformer of the local network station using the measured input current, the measured output current, the measured output voltage and the phase angle between the output current and the output voltage. The method also includes determining the input voltage of the transformer of the local network station based on the determined translation ratio and the determined admittance of the cross-member of the p-equivalent circuit diagram.

15 Claims, 3 Drawing Sheets

(56) References Cited

OTHER PUBLICATIONS

T. Kim et al., "Considerations for the Feasible Operating Range of Distributed Generation interconnected to Power Distribution System", 2002 IEEE Power Engineering Society, Summer Meeting, Conference Proceedings, Chicago, IL, Jul. 21-25, 2002, pp. 42-48, vol. 1.

A. Miki et al., "A Calculation Method for Impulse Voltage Distribution and Transferred Voltage in Transformer Windings", IEEE Transactions on Power Apparatus and Systems, May 1, 1978, pp. 930-939, vol. PAS-97, No. 3.

* cited by examiner

METHOD AND DEVICE FOR DETERMINING AN INPUT VOLTAGE ON A TRANSFORMING STATION OF A POWER NETWORK

RELATED APPLICATIONS

This application claims priority as a continuation application under 35 U.S.C. §120 to PCT/EP2010/006003, which was filed as an International Application on Oct. 1, 2010 designating the U.S., and which claims priority to German Application 10 2009 048 509.0 filed in Germany on Oct. 9, 2009. The entire contents of these applications are hereby incorporated by reference in their entireties.

FIELD

The present disclosure relates to power distribution technology, including transforming stations such as substations which connect the medium-voltage and low-voltage level of an electricity network to one another. More particularly, the present disclosure relates to a method and device for determining the medium voltage which is present in the transforming station of a power network.

BACKGROUND INFORMATION

Electricity networks for the transmission of electrical power generally have a series of substations, which connect a very-high-voltage level, a high-voltage level, a medium-voltage level and a low-voltage level to one another. In the past, electrical power was produced centrally by power stations, as a result of which the direction of the power flow in the electricity networks was known, specifically from the high-voltage level to the low-voltage level. Until now, it has therefore been possible to assume that the medium voltage at the output of the substation is at the most between the high-voltage level and the medium-voltage level, and that this falls correspondingly in the direction of an input of a transforming station. With the increase in decentralized generating installations, the distribution networks have become subject to new requirements. Within the context of the exploitation of the renewable energy sources, very-small generating installations are increasingly being connected to the electricity network, producing electrical power which is fed into the medium-voltage level, in particular close to the transforming stations. As a result, load peaks can occur because of feedback, and can damage end-user appliances as a result of impermissible excessive voltages.

Furthermore, in general, the feeding behavior of very-small generating installations, that is to say the reliability and the amount of power produced, for example in the case of solar installations and the like, is unpredictable. In the future, it will be desirable to provide better monitoring for the power flow in the electricity network, for example, at the medium-voltage level. In order to obtain information about the power flows and the voltage profile in the medium-voltage networks without having to equip all the transforming stations with instrumentation, it will be necessary to know the medium voltage which is present on the input side at some transforming stations. However, without direct measurement at the transforming stations, the medium voltages which are present there cannot easily be derived.

Furthermore, no instrumentation is normally installed in existing transforming stations, by means of which it is possible to detect the medium voltage which is present on the input side at the transforming station. Because of the compact design of transforming stations, it is generally difficult to retrofit such voltage measurement on the input side.

Furthermore, in the case of existing installations, the no-load currents of the transformers in the transforming station are unknown, as a result of which it is not easily possible to calculate back the medium voltage which is present on the input side, on the basis of a voltage which can be measured easily and is therefore known, and a current which can be measured easily and is therefore known on the low-voltage side of the transformer. In addition, the transformer tap position, that is to say the transformation ratio of the transformer can occasionally be manually matched to changed medium voltages, in order to achieve the desired network voltage at the low-voltage level. However, automatic detection of a change in a transformer tap position is possible, but difficult. Manual readjustment is also problematic, since tap position changes are normally not carried out by the specialist personnel who are also trained for changing the configuration of the local instrumentation and automation.

SUMMARY

An exemplary embodiment of the present disclosure provides a method for determining an input voltage of a transformer in a transforming station. The exemplary method includes measuring an input current of the transformer, an output current of the transformer, an output voltage of the transformer and a phase angle between the output current and the output voltage of the transformer. The exemplary method also includes determining, by a processor of a computing device, a transformation ratio and complex admittances of parallel elements of the transformer in the transforming station based on the measured input current, the measured output current, the measured output voltage and the measured phase angle between the output current and the output voltage. In addition, the method includes determining, by the processor of the computing device, the input voltage of the transformer in the transforming station based on the determined transformation ratio and the determined admittances of the parallel elements.

A measurement and monitoring unit for determining an input voltage of a transformer in a transforming station. The exemplary measurement and monitoring unit includes a voltage measurement unit configured to measure an output voltage of the transformer, at least one current measurement unit configured to measure an input current of the transformer and an output current of the transformer, and a phase difference unit configured to determine a phase angle between the output current and the output voltage. The exemplary measurement and monitoring unit also includes a calculation unit configured to determine a transformation ratio and an admittance of parallel elements of the transformer in the transforming station based on the measured input current, the measured output current, the measured output voltage and the phase angle between the output current and the output voltage, and to determine an input voltage of the transformer in the transforming station based on the determined transformation ratio and the determined admittance of the parallel elements.

BRIEF DESCRIPTION OF THE DRAWINGS

Additional refinements, advantages and features of the present disclosure are described in more detail below with reference to exemplary embodiments illustrated in the drawings, in which.

DETAILED DESCRIPTION

Figure 1:
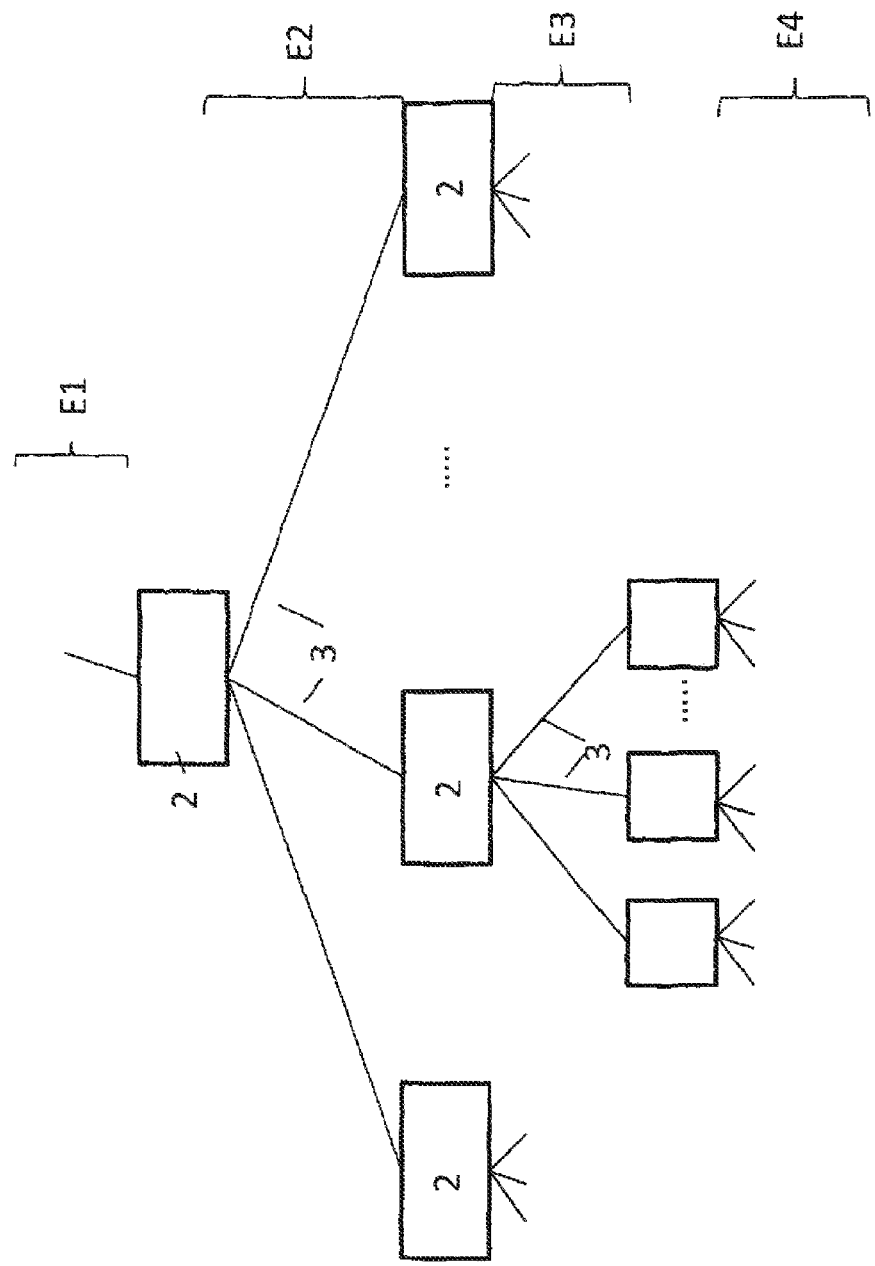
FIG. 1 shows a schematic illustration of an electricity network with various voltage levels according to an exemplary embodiment of the present disclosure.

Exemplary embodiments of the present disclosure provide a method and an apparatus which allow the input voltage on the high-voltage side of a transformer in a transforming station to be determined easily, even in existing transforming stations, for example, with transformers of a relatively old type.

According to an exemplary embodiment, a method is provided for determining an input voltage of a transformer in a transforming station. The method includes measuring an input current of the transformer, an output current of the transformer, an output voltage of the transformer and a phase angle between the output current and the output voltage of the transformer. The exemplary method also includes determining a transformation ratio of the complex admittance, for example, of parallel elements of a p-equivalent circuit of the transformer in the transforming station, or other values from which this admittance can be derived, with the aid of the measured input current, the measured output current, the measured output voltage and the phase angle between the output current and the output voltage. In addition, the exemplary method includes determining the input voltage of the transformer in the transforming station on the basis of the determined transformation ratio and of the previously determined complex admittance, such as the determined equivalent circuit.

An exemplary embodiment of the present disclosure determines the input voltage which is present on the input side without prior knowledge of the transformation ratio, of the no-load current, of the iron losses and/or also of the copper losses of the transformer in a transforming station, or by prior knowledge of variables from which the no-load current of the transformer can be derived. This can be done by first of all determining the transformation ratio and, when using a p-equivalent circuit, the admittance of the parallel elements with the aid of the magnitudes of the output voltage of the transformer, of the input current and of the output current. In addition, all that is required is transformer characteristic data which can normally be taken from the rating plate on the transformer, and from which the series element in the p-equivalent circuit of the transformer in the transforming station can be determined. By way of example, this may be the relative short-circuit voltage of the transformer in combination with its rated apparent power and its rated currents.

According to an exemplary embodiment, the initially unknown elements in the equivalent circuit of the transformer in the transforming station can be determined by solving an equation system which takes account of at least three measured-value sets comprising the input current ($I_{OS}$) of the transformer, the output current ($I_{US}$) of the transformer and the output voltage ($U_{US}$). When using the p-equivalent circuit, the initially unknown elements are the parallel elements Y and the transformation ratio ü.

It is also possible to use more than three of the above-mentioned measured-value sets, such as the input current ($I_{OS}$) of the transformer, the output current ($I_{US}$) of the transformer and the output voltage ($U_{US}$) of the transformer, which lead to an overdefined equation system which, for example, can be solved using the mathematical non-linear state estimation method.

According to an exemplary embodiment, a measurement and monitoring unit is provided for determining an input voltage of a transformer in a transforming station. The exemplary measurement and monitoring unit includes a voltage measurement unit for measuring an output voltage of the transformer, current measurement units for measuring an input current of the transformer and an output current of the transformer, and a phase difference unit for determining a phase angle between the output current and the output voltage. The exemplary measurement and monitoring unit also includes a calculation unit, which may be embodied by a processor of a computer processing device (e.g., a computer), for example. The calculation unit is configured to determine the transformation ratio and the admittance of a parallel element of a p-equivalent circuit of the transformer in the transforming station with the aid of the measured input current, the measured output current, the measured output voltage and the phase angle between the output current and the output voltage. The calculation unit is also configured to determine the input voltage of the transformer in the transforming station on the basis of the determined transformation ratio and of the admittance, for example, of the parallel element in the p-equivalent circuit.

FIG. 1 schematically shows an electricity network 1 with transmission lines 3, which electricity network 1 has a very-high-voltage level E1, a high-voltage level E2, a medium-voltage level E3 and a low-voltage level E4. For the sake of simplicity, the transmission lines are shown as single lines, although a plurality of transmission lines are generally provided for transmission of the electricity. Substations 2 are provided between the voltage levels E1 to E4 and have, as the main component, a transformer in order to transform the voltages from a relatively high-voltage level to a relatively low-voltage level. Substations between the medium-voltage level E3 and the low-voltage level E4 are referred to as transforming stations.

While the substations 2 between the very-high-voltage level E1 and the high-voltage level E2, as well as between the high-voltage level E2 and the medium-voltage level E3, can easily be equipped with appropriate measurement apparatuses for measurement of the voltages on the input side and on the output side (input voltage and output voltage), because there are comparatively few of them and they are physically relatively large, this can be achieved only with increased complexity for the transforming stations, simply because there are a large number of them. Furthermore, the transforming stations are normally of compact design and it is therefore generally difficult to provide an input-side voltage measurement, particularly in the case of existing installations.

Until now, it has been known to provide only one or only a small number of feed points for the medium-voltage level. By way of example, the feed point may correspond in FIG. 1 to a substation 2 between the high-voltage level E2 and the medium-voltage level E3. The voltage at the medium-voltage level E3 is highest at this feed point, and falls as the distance from the feed point increases. The direction of the power flow was always known. This situation is visibly changing since, because of the addition of decentralized generating installations, for example from regenerative energy sources, the current and voltage distribution in the medium-voltage level is difficult to predict. This is particularly the case when the availability of the decentralized generating installation cannot be predicted, as is the case, for example, with wind-power or solar installations.

However, in order to make it possible to monitor the state at the medium-voltage level E3, it is helpful to know the input voltage which is present on the input side at the transforming stations, since this voltage includes not only information relating to the measured station but also information relating to the adjacent stations. This allows the state of the feeding station to be deduced relatively accurately with a small number of measurements within a medium-voltage outgoer in combination with the measurements which are available in any case in the feeding station.

For example, an excessively high input voltage $U_{OS}$ on the input side of the transforming stations may be problematic since, because of the effectively non-variable transformation ratio of the transformer in the transforming station, this would lead to an increased network voltage (low voltage), which is supplied to the consumers. This can cause damage to connected terminals or reduce their life.

Instead of a direct measurement of the input voltage which is present on the high-voltage side, the input voltage which is present on the high-voltage side can be determined by measuring the output voltage $U_{US}$ which is present on the output side on the transformers in the transforming stations 2, and the output current $I_{US}$ flowing on the output side, with the aid of electrical characteristic variables of the transformer (e.g., ü: transformation ratio, that is to say the ratio of the number of turns on the primary side to the number of turns on the secondary side, Y: parallel elements in a p-equivalent circuit of the transformer), although, particularly in the case of relatively old transforming stations, the electrical characteristic variables which are required for this purpose are not all known. This relates in particular to the no-load losses. In addition, detailed statements relating to the transformation ratio ü and the parallel elements Y in the p-equivalent circuit are not available. The only information which is always stated is that relating to the relative short-circuit voltage $u_K$, to a rated voltage $U_{OSr}$ on the high-voltage side, to a rated voltage on the low-voltage side and to a rated current, with this in general being on the rating plates on the transformers in the transforming stations, as a result of which this information can be assumed to be known. The relative short-circuit voltage $u_K$ for transformers is the voltage which must be present on the primary winding when the secondary winding is short-circuited for the primary winding to carry a rated current. This is given by:

$$u_k = U_k \cdot 100\% / U_{OSr},$$

where $U_k$ is the measured short-circuit voltage and $U_{OSr}$ is the rated voltage on the high-voltage side.

Figure 2:
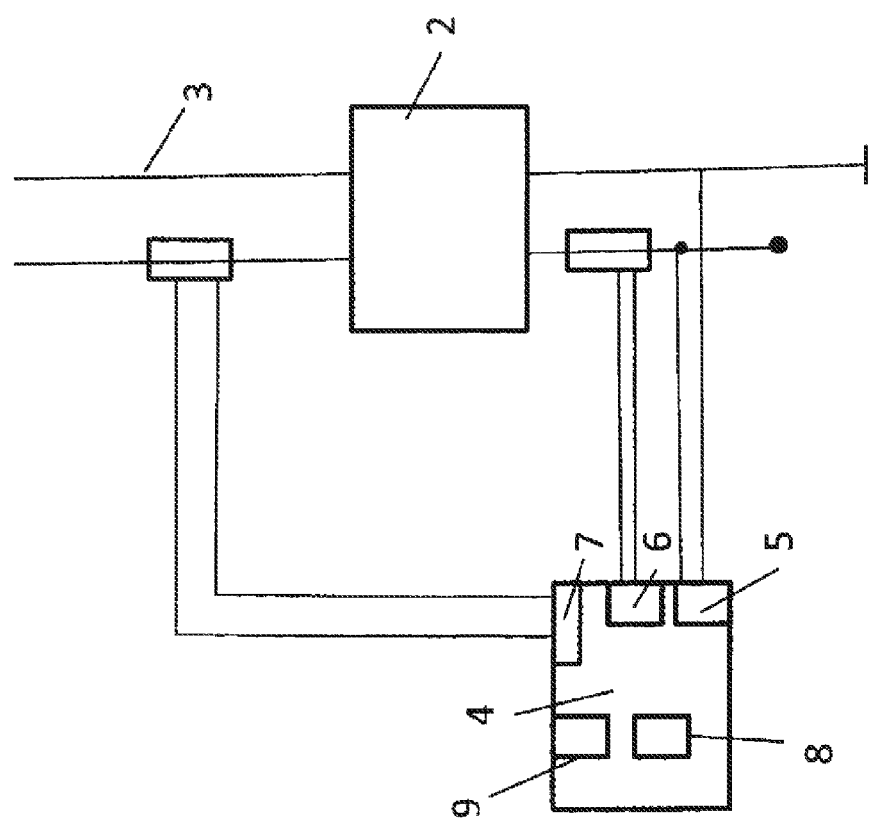
FIG. 2 shows a schematic illustration of a substation apparatus, in particular of a transforming station according to an exemplary embodiment of the present disclosure.

FIG. 2 shows an exemplary system with a substation apparatus 2, for example, a substation apparatus for a transforming station, which is coupled to a measurement and monitoring unit 4. The measurement and monitoring unit 4 measures an output voltage on the output side of the substation apparatus 2 with the aid of a voltage measurement unit 5, and an output current of the substation apparatus 2 with the aid of a first current measurement unit 6, and the current flowing on the input side into the substation apparatus 2, with the aid of a second current measurement unit 7.

The current measurement units 6, 7 may be in the form of current transformers, and may include so-called cable-type current transformers, which have one or more windings around the relevant conductor in which a flowing current is intended to be measured. A measurement voltage is induced in the winding, which measurement voltage is proportional to the current flow in the conductor. The measurement voltages produced by the current transformers are measured with the aid of the current measurement units 6, 7 in the measurement and monitoring unit 4, and appropriate details relating to the input current $I_{OS}$ and output current $I_{US}$ respectively flowing into the input side and out of the output side of the transformer in the substations 2 are produced in the measurement and monitoring unit 4. The subsequent calculations in order to determine the input voltage $U_{OS}$ are carried out with the aid of a calculation unit 9.

Furthermore, an output voltage $U_{US}$ on the output side of the substation 2 is measured by means of the voltage measurement unit 5 in the measurement and monitoring unit 4. By way of example, the voltage measurement may be carried out using a conventional analog/digital converter. A phase shift is determined from the measured output voltage $U_{US}$ and the output current $I_{US}$ in a phase-difference detector 8, and is produced as the phase-angle difference φ between the output voltage $U_{US}$ and the output current $I_{US}$.

Figure 3:
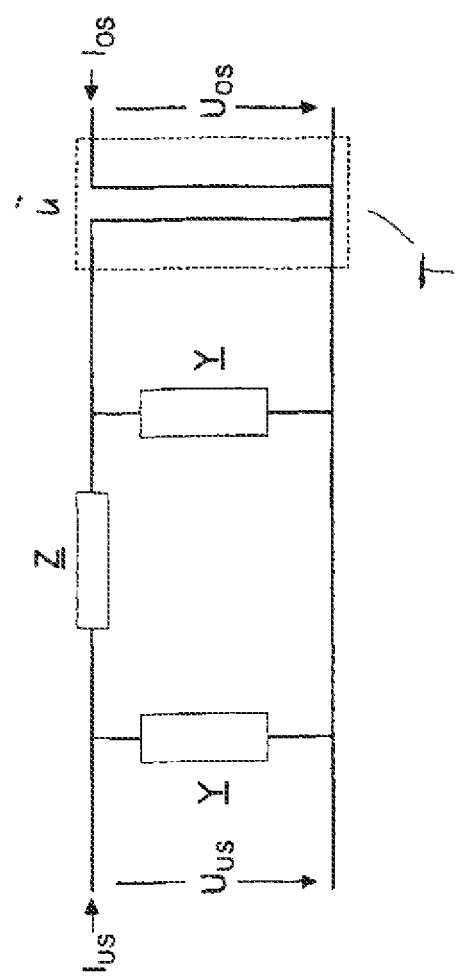
FIG. 3 shows an equivalent circuit of a transformer in a transforming station according to an exemplary embodiment of the present disclosure.

FIG. 3 shows the p-equivalent circuit of the transformer in the transforming station 2. The p-equivalent circuit envisages an ideal transformer T, which has a p-circuit including two parallel elements Y and a series element Z added to it on the input side. A first parallel element connects the input connections of the transformer in the transforming station to one another. A second parallel element with an identical admittance Y connects the input connections of the ideal transformer T to one another. The series element is arranged in series between the parallel elements, which are therefore arranged in parallel with the ideal transformer.

While the magnitude of the impedance Z of the series element can be determined from the relative short-circuit voltage $u_k$ and, for the sake of simplicity, this can be assumed to be purely inductive in the case of transformers in transforming stations—if, for example, no information is available about the copper losses—the admittance Y of the parallel elements is initially unknown. The tap connections on the transformer and therefore the transformation ratio ü are likewise assumed to be unknown, since the tap position can be changed without the equipment on the secondary side in the station being aware of this.

In the measurement and monitoring unit 4, the unknown admittances Y of the parallel elements in the transformer and its transformation ratio ü are determined from the input current $I_{OS}$, the output current $I_{US}$ and the output voltage $U_{US}$, as well as the impedance Z, which is assumed to be known, of the series element. This involves at least three measured-value sets, including the input current $I_{OS}$, the output voltage $U_{US}$, the output current $I_{US}$ and the phase-angle difference φ between the output voltage $U_{US}$ and the output current $I_{US}$, at times when the load is different. Better results are achieved when using a greater number of measured-value sets, since this makes it possible to reduce the consequences of measurement errors.

One possible way to determine ü and Y jointly is to solve the following equation, which is based on the p-equivalent circuit shown in FIG. 3:

$$\left|\frac{I_{OS}}{I_{US}}\right| = \left|\underline{A} \cdot \frac{U_{US}}{I_{US}} + \underline{B}\right|$$

where $\underline{A} = \underline{Y} \cdot (2 + \underline{Z} \cdot \underline{Y}) \cdot \overline{u}$ and $$\underline{B} = \frac{1 + \underline{Z} \cdot \underline{Y}}{\overline{u}}$$

The variables Y and ü in the equation are unknown. Since Y includes a real part $Y_r$ and an imaginary part $Y_i$, this corresponds to three real unknown variables $Y_r$, $Y_i$ and ü. The magnitude of the ratio of $\underline{I}_{OS}$ and $\underline{I}_{US}$ in the equation is known from the two current measurements. The complex ratio of $\underline{U}_{US}$ and $\underline{I}_{US}$ in the right-hand part of the equation is likewise known. While currents and voltages vary in different load situations, all the other elements in the equation are constant. An equation system which can be solved is obtained only by evaluation of the equation at three different times.

Since the measured values in the measured-value sets are in practice subject to errors, not only is the minimum required number of three measured-value sets used for calculation, but considerably more, for example 100. This makes it possible to estimate the electrical parameters of the elements in the equivalent circuit with high accuracy on the basis of the known mathematical method of non-linear state estimation. In this method, in the case of an overdefined equation system, the most probable solution is found. For example, the parallel elements Y and the transformation ratio ü can be determined in a known manner from a highly overdefined equation system, thus resulting in the minimum possible discrepancy for the variables to be determined, overall, when using the measured values from the measured-value sets. If the parameters admittance Y and the transformation ratio ü are determined in this way, then the input voltage $U_{OS}$ on the high-voltage side of the transformer can then be determined directly when each new measured-value set is received.

Since the input current $I_{OS}$ can also be calculated, although this is also additionally measured, the described method includes a regular check of the quality of the calculation. For example, if there is a discrepancy between the measured and the calculated input current $I_{OS}$ beyond a specific current threshold value, another process for determination of the complex admittances Y and the transformation ratio ü can be started, in order to correct these values. For example, a situation such as this can occur when a tap position on the transformer in the transforming station has been changed.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCE SYMBOLS

1 Electricity network
2 Substation
3 Transmission lines
4 Measurement and monitoring unit
5 Voltage measurement unit
6, 7 Current measurement units
8 Phase difference detector
9 Calculation unit
$u_k$ Relative short-circuit voltage
$U_k$ Short-circuit voltage
Y Complex admittance of the parallel elements, for example in the p-equivalent circuit of the transformer
Z Complex impedance of the series element, for example in the p-equivalent circuit of the transformer
$U_{US}$ Output voltage
$I_{US}$ Output current
$U_{OS}$ Input voltage
$I_{OS}$ Input current
$U_{OSr}$ Rated voltage on the high-voltage side of the transformer

What is claimed is:

1. A method for determining an input voltage of a transformer in a transforming station, the method comprising:
   measuring an input current of the transformer, an output current of the transformer, an output voltage of the transformer and a phase angle between the output current and the output voltage of the transformer;
   determining, by a processor of a computing device, a transformation ratio and complex admittances of parallel elements of the transformer in the transforming station based on the measured input current, the measured output current, the measured output voltage and the measured phase angle between the output current and the output voltage; and
   determining, by the processor of a computing device, the input voltage of the transformer in the transforming station based on the determined transformation ratio and the determined admittances of the parallel elements.

2. The method as claimed in claim 1, wherein the transformation ratio and the admittances of the parallel elements are determined by means of statements relating to at least one of a rated voltage on a high-voltage side of the transformer, a relative short-circuit voltage and a rated current on the high-voltage side.

3. The method as claimed in claim 1, wherein the transformation ratio and the admittances are determined by solving an equation system,
   wherein the equation system is solved using a transformation matrix of a p-equivalent circuit of the transformer.

4. The method as claimed in claim 3, wherein the equation system is overdefined, and is solved using a non-linear state estimation.

5. The method as claimed in claim 4, comprising:
   determining a plurality of measured-value sets of the input current of the transformer, of the output current of the transformer and of the output voltage of the transformer are determined, to increase the overdefinition of the equation system.

6. The method as claimed in claim 3, wherein the p-equivalent circuit provides two parallel elements with admittances, between which a series element with an impedance is arranged in series, and
   wherein an imaginary part of the impedance is determined approximately by determining a magnitude of the impedance.

7. The method as claimed in claim 3, wherein the p-equivalent circuit provides two parallel elements with admittances, between which a series element with an impedance is arranged in series, and
   wherein the impedance is determined from the relative or absolute short-circuit voltage and copper losses.

8. A measurement and monitoring unit for determining an input voltage of a transformer in a transforming station, comprising:
   a voltage measurement unit configured to measure an output voltage of the transformer;
   at least one current measurement unit configured to measure an input current of the transformer and an output current of the transformer;
   a phase difference unit configured to determine a phase angle between the output current and the output voltage; and
   a calculation unit configured to determine a transformation ratio and an admittance of parallel elements of the transformer in the transforming station based on the measured input current, the measured output current, the measured output voltage and the phase angle between the output current and the output voltage, and to determine an input voltage of the transformer in the transforming station based on the determined transformation ratio and the determined admittance of the parallel elements.

9. The method as claimed in claim 2, wherein the transformation ratio and the admittances are determined by solving an equation system,
wherein the equation system is solved using a transformation matrix of a p-equivalent circuit of the transformer.

10. The method as claimed in claim 9, wherein the equation system is overdefined, and is solved using a non-linear state estimation.

11. The method as claimed in claim 10, comprising:
determining a plurality of measured-value sets of the input current of the transformer, of the output current of the transformer and of the output voltage of the transformer are determined, to increase the overdefinition of the equation system.

12. The method as claimed in claim 4, wherein the p-equivalent circuit provides two parallel elements with admittances, between which a series element with an impedance is arranged in series, and
wherein an imaginary part of the impedance is determined approximately by determining a magnitude of the impedance.

13. The method as claimed in claim 4, wherein the p-equivalent circuit provides two parallel elements with admittances, between which a series element with an impedance is arranged in series, and
wherein the impedance is determined from the relative or absolute short-circuit voltage and copper losses.

14. The method as claimed in claim 1, wherein the determining of the transformation ratio and the admittances of parallel elements includes determining the transformation ratio and the admittances of a p-equivalent circuit of the transformer.

15. The measurement and monitoring unit as claimed in claim 8, wherein the calculation unit is configured to determine the transformation ratio and admittance of a p-equivalent circuit of the transformer, and to determine the input voltage of the transformer based on the determined transformation ratio and the determined admittance of the p-equivalent circuit.

* * * * *